(12) United States Patent
Chung

(10) Patent No.: US 7,884,671 B2
(45) Date of Patent: Feb. 8, 2011

(54) LOW POWER OPERATIONAL AMPLIFIER

(75) Inventor: Kyu-young Chung, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 12/630,202

(22) Filed: Dec. 3, 2009

(65) Prior Publication Data

US 2010/0134186 A1   Jun. 3, 2010

(30) Foreign Application Priority Data

Dec. 3, 2008   (KR) ...................... 10-2008-0122040

(51) Int. Cl.
*H03F 3/45* (2006.01)
(52) U.S. Cl. ...................... 330/255; 330/261
(58) Field of Classification Search ................ 330/255, 330/261, 257, 253
See application file for complete search history.

(56) References Cited

U.S. PATENT DOCUMENTS 4,797,631 A * 1/1989 Hsu et al. ................... 330/253
5,731,739 A * 3/1998 Ho ............................. 330/253
6,441,649 B1 * 8/2002 Martin et al. ................. 327/52
6,982,597 B2 * 1/2006 Mitarashi ..................... 330/253
7,557,658 B2 * 7/2009 Perez .......................... 330/255

FOREIGN PATENT DOCUMENTS

| JP | 11-136044 | 5/1999 |
|---|---|---|
| JP | 2004-297462 | 10/2004 |
| JP | 2006-174035 | 6/2006 |
| JP | 2007-208316 | 8/2007 |

* cited by examiner

*Primary Examiner*—Henry K Choe
(74) *Attorney, Agent, or Firm*—Stanzione & Kim, LLP

(57) ABSTRACT

An amplifier which operates with low power is provided. In the amplifier, a first input unit includes a first control circuit and a second control circuit each including one terminal connected to an output node and the other terminal connected to a respective input transistor from among the plurality of input transistors, and controls the amount of current flowing into the plurality of input transistors or flowing out of the plurality of input transistors according to operating modes of the amplifier, whereby even when an A bias current is increased in order to increase a slew rate of the amplifier, a B bias current a the quiescent current do not increase.

17 Claims, 11 Drawing Sheets

FIG. 11

| Item | Conventional op-amp | Present op-amp |
|---|---|---|
| Current dissipation of one amp | 1.62uA | 0.71uA |
| Total current consumption in HVGA source driver (960-ch) | 1555.2uA | 681.6uA |
| Amout of reduced current compared to HVGA source driver applying the conventional op-amp | - | 873.6uA |
| Current reduction ratio compared to the conventional op-amp | - | 56.2% |

LOW POWER OPERATIONAL AMPLIFIER

CROSS-REFERENCE TO RELATED APPLICATIONS

This application claims the benefit of Korean Patent Application No. 10-2008-0122040, filed on Dec. 3, 2008, in the Korean Intellectual Property Office, the disclosure of which is incorporated herein in its entirety by reference.

BACKGROUND

1. Field of the Invention

The inventive concept relates to a semiconductor device, and more particularly, to an amplifier capable of operating with low power.

Push-pull amplification circuits including CMOS transistors are widely in use. A push-pull amplification circuit can drive either a positive or a negative current into a load. For example, a complementary pair of transistors may be used: one to sink current from the load to ground and the other to supply current to the load from a positive power supply.

Amplification circuits widely used as typical acoustic amplifiers are roughly classified into analog amplification circuits and digital amplification circuits. Examples of analog amplification circuits, in which linearity is important, include class-A, class-B, and class-AB amplification circuits. An example of the digital amplification circuits is a class-D amplification circuit.

In a class A amplifier, 100% of the input signal is used all of the time to generate the amplified output. Class A amplifiers may be more linear than other types, but they may also be inefficient. In a class B amplifier, 50% of the signal is used to generate the amplified output. While class B amplifiers may be more efficient than class A amplifiers, class B amplifiers may suffer from signal distortion. For example, if two class B amplifiers are used together to reproduce an input signal (each amplifying one half of the signal), the amplified output signal may be distorted if the two class B amplifiers do not transition smoothly to generate the amplified output signal. This type of distortion is called crossover distortion.

Unlike class A and B amplifiers, class AB amplifiers contain two active elements that each amplify the input signal over half of the waveform. However, an element still outputs a signal of a lesser magnitude, even during its "inactive" half of the waveform to reduce crossover distortion. In other words, since each active element continues outputting to a lesser extent in its "off" half of the waveform, a dead zone, or zone where both elements are nearly off, may be reduced or eliminated.

Class D amplifiers include switching amplifiers, or pulse-width modulation amplifiers, which convert an input signal into output "pulses" having higher voltages than the input signal. Class D amplifiers may be more energy-efficient than classes A, B, and AB. A user may select any of the above amplifiers to amplify an input signal based on desired characteristics including cost, distortion, energy-efficiency, availability, and desired linearity of an amplified output signal to an input signal.

2. Description of the Related Art

Amplifiers generally have at least two stages: an input stage to prepare a signal for amplification and an output stage to amplify the signal. An input stage may include input ports, filters, signal conditioning, etc. An output stage may include transistors, such as MOSFETS, and a power supply connection. When an input signal from the input stage enters the output stage, the output stage may amplify the signal by supplying a voltage from the power supply connection to increase the amplitude of the signal, for example.

Modern amplifiers may utilize transconductance to amplify an input signal. In other words, an amplifier may convert an input signal voltage into a current and output the current to the output stage of the amplifier. The output stage may then convert the current back into an output voltage amplified by the power supply. The current output from the input stage influences the slew rate of the amplifier. More specifically, the slew rate may be determined by the maximum current supplied to a compensating capacitor in an output stage of the amplifier. The slew rate, in turn, influences the frequency response of the amplifier, or the maximum allowable frequency of an input signal without distorting an output signal.

Some types of distortion that may degrade an output signal include crossover distortion, as discussed above, noise, harmonic distortion, clipping, and intermodulation distortion.

However, while supplying a larger current to a compensation capacitor may increase a slew rate of the amplifier, and thus its maximum frequency response, it may also increase the heat output, power consumption, and/or size of the amplifier.

SUMMARY

The present general inventive concept provides an amplifier that can operate at low power by reducing current consumption.

Additional features and utilities of the present general inventive concept will be set forth in part in the description which follows and, in part, will be obvious from the description, or may be learned by practice of the general inventive concept.

According to an aspect of the inventive concept, there is provided a folded cascode amplifier including a class-AB input terminal. The amplifier may include a first input unit to receive an A bias current and to transform a difference between an input voltage and an output voltage of the amplifier into a corresponding current amount, and including a plurality of input transistors; a second input unit to receive a B bias current and to control a voltage output to an output unit based on the current received from the first input unit; and an output unit to output an output voltage to an output node controlled by an output control unit connected to the second input unit, and to generate a quiescent current that flows from the output control unit to a ground voltage.

The first input unit may include a first control circuit and a second control circuit each including one terminal connected to the output node and the other terminal connected to a respective input transistor from among the plurality of input transistors, and each of the first control circuit and the second control circuit controls the amount of current flowing into the plurality of input transistors or flowing out of the plurality of input transistors according to operating modes of the amplifier, whereby even when the A bias current is increased to increase a slew rate of the amplifier, the B bias current and the quiescent current do not increase.

The first input unit may include a first current source connected to a power supply voltage and a first node to supply a first bias current to the first node and a second current source connected to a ground voltage and a second node to direct a second bias current out of the second node. The plurality of input transistors may each include one terminal connected to one of the first node and the second node and another terminal connected to the second input unit. A gate of each input transistor may receive one of the input voltage and the output voltage.

The first control circuit may include a third current source connected to a power supply voltage and a third node to supply a third bias current to the third node, wherein the third bias current may be greater than the first bias current by (n−1) times, where n denotes a natural number equal to or greater than 2; a first control transistor and a second control transistor serially connected to each other between the third node and the output node, wherein the first control transistor may receive at its gate one of the input voltage or the output voltage and the second control transistor may receive at its gate the other of the input voltage and the output voltage; a third control transistor and a fourth control transistor serially connected to each other between the first node and the third node, both of the third and fourth control transistors to receive at their gates one of the input voltage or the output voltage; and a fifth control transistor and a sixth control transistor serially connected to each other and connected in parallel with the third control transistor and the fourth control transistor, both of the fifth and sixth control transistors to receive the other of the input and output voltages other than the voltage received at the gates of the third and fourth control transistors.

At least one of the first through sixth control transistors may include a plurality of control circuits.

The second control circuit may include a fourth current source connected to a ground voltage and a fourth node to direct a fourth bias current out of the fourth node, wherein the fourth bias current is (n−1) times greater than the first bias current, where n denotes a natural number equal to or greater than 2; a seventh control transistor and an eighth control transistor serially connected to each other between the fourth node and the output node, wherein the seventh control transistor receives one of the input voltage or the output voltage at its gate and the eighth control transistor receives at its gate one of the input voltage and output voltage other than the voltage received at the gate of the seventh control transistor; a ninth control transistor and a tenth control transistor serially connected to each other between the second node and the fourth node, both of the ninth and tenth control transistors to receive at their gates one of the input voltage or the output voltage; and an eleventh control transistor and a twelfth control transistor serially connected to each other and connected in parallel with the ninth control transistor and the tenth control transistor, an receiving at their gates one of the input voltage and output voltage other than the voltage received at the gates of the ninth and tenth control transistors.

At least one of the seventh through twelfth control transistors may include a plurality of control circuits.

The input transistors may include a first input transistor having one terminal connected to the first node and the other terminal connected to a fifth node of the second input unit and receiving the input voltage at its gate; a second input transistor having one terminal connected to the second node and the other terminal connected to a sixth node of the second input unit and receiving the input voltage at its gate; a third input transistor having one terminal connected to the second node and the other terminal connected to a seventh node of the second input unit and receiving the output voltage at its gate; and a fourth input transistor having one terminal connected to the first node and the other terminal connected to an eighth node of the second input unit and receiving the output voltage at its gate.

The output control unit of the output unit may include a pull-up transistor and a pull-down transistor which are serially connected to each other between the power supply voltage and the ground voltage. When the input voltage is greater than the output voltage, the sixth node may lower a node voltage of a ninth node of the second input unit, which controls a gating operation of the pull-up transistor.

Alternatively, when the input voltage is smaller than the output voltage, the fifth node may raise a node voltage of a tenth node of the second input unit, which controls a gating operation of the pull-down transistor.

In an operating mode where the input voltage is the same as the output voltage, the voltage of the sixth node and the voltage of the fifth node may remain unchanged.

Other features and/or utilities of the present general inventive concept may be provided by an amplifier, comprising: a first input unit to receive a first voltage and convert the first voltage into a first current; a second input unit to receive the first current from the first input unit and to convert the first current into a second voltage; and an output unit to receive the second voltage from the second input unit and to convert the second voltage into an output voltage. The first input unit may comprise: a plurality of input transistors, a first control unit, and a second control unit. The first control unit may comprise: a plurality of first control transistors connected between a first current source and a first input transistor; and a plurality of second control transistors connected between the first current source and an output of the amplifier. The second control unit may comprise: a plurality of third control transistors connected between a second current source and a second input transistor; and a plurality of fourth control transistors connected between the second current source and the output of the amplifier.

The first input unit may further comprise a third current source connected to a first node between the first control unit and the plurality of input transistors; and a fourth current source connected to a second node between the second control unit and the plurality of input transistors.

The plurality of first control transistors comprise at least first and second rows of transistors connected in series, source-to-drain, the rows connected in parallel with each other; each transistor of the first row may have a gate connected to an input voltage of the amplifier; each transistor of the second row may have a gate connected to an output voltage of the amplifier; a transistor at one end of each of the first and second rows may have a source connected to the first current source, and a transistor at the other end of each of the first and second rows may have a drain connected to the first node of the first input unit; and the plurality of second control transistors may comprise a third row of transistors comprising a first transistor having a gate connected to the input voltage of the amplifier and a second transistor having a gate connected to the output voltage of the amplifier, a transistor at one end of the third row may have a source connected to the first current source, and a transistor at the other end of the third row may have a drain connected to the output of the amplifier.

The plurality of third control transistors may comprise at least fourth and fifth rows of transistors connected in series, source-to-drain, the rows connected in parallel with each other; each transistor of the fourth row may have a gate connected to an input voltage of the amplifier; each transistor of the fifth row may have a gate connected to an output voltage of the amplifier; a transistor at one end of each of the fourth and fifth rows may have a source connected to the second current source, and a transistor at the other end of each of the fourth and fifth rows may have a drain connected to the second node of the first input unit; and the plurality of fourth control transistors may comprise a sixth row of transistors comprising a first transistor having a gate connected to the input voltage of the amplifier and a second transistor having a gate connected to the output voltage of the amplifier, a transistor at one end of the sixth row may have a source connected to the second current source, and a transistor at the other end of the sixth row may have a drain connected to the output of the amplifier.

The plurality of first input transistors may comprise: a first input transistor having a gate, a source, and a drain, the gate being connected to an input voltage source, the source of the first input transistor being connected to one of the first node of the first input unit and a third node of the second input unit, and the drain being connected to the other of the first node and the third node; a second input transistor having a gate, a source, and a drain, the gate being connected to the input voltage source, the source of the second input transistor being connected to one of the second node of the first input unit and a fourth node of the second input unit, and the drain being connected to the other of the second node and the fourth node; a third input transistor having a gate, a source, and a drain, the gate being connected to an output voltage of the amplifier, the source being connected to one of the second node of the first input unit and a fifth node of the second input unit, and the drain being connected to the other of the second node and the fifth node; and a fourth input transistor having a gate, a source, and a drain, the gate being connected to the output voltage of the amplifier, the source being connected to one of the first node of the first input unit and a sixth node of the second input unit, and the drain being connected to the other of the first node and the sixth node.

The second input unit may comprise: a first row of transistors connected in series between a power supply and a fifth current source and having the fifth node located at a connection of a source of one transistor in the first row and a drain of another transistor in the first row; a second row of transistors connected in series between the power supply and a voltage source and having the fourth node located at a connection of a source of one transistor in the second row and a drain of another transistor in the second row; a third row of transistors connected in series between the fifth current source and ground and having the sixth node located at a connection of a source of one transistor in the third row and a drain of another transistor in the third row; and a fourth row of transistors connected in series between the voltage source and ground and having the third node located at a connection of a source of one transistor in the fourth row and a drain of another transistor in the fourth row; wherein a seventh node located where a terminal of a transistor in the second row connects to a terminal of the voltage source is connected to the output of the amplifier via a first compensation capacitor; and an eighth node located where a terminal of a transistor in the fourth row connects to a terminal of the voltage source is connected to the output of the amplifier via a second compensation capacitor.

The output unit may comprise: a push-up transistor and a pull-down transistor connected in series between a power supply and a ground source, the push-up transistor having a gate terminal to receive a voltage from one of the seventh node and the eighth node, the pull-down transistor having a gate terminal to receive a voltage from the other one of the seventh node and the eighth node than that received by the gate terminal of the push-up transistor; and at least the first and second compensation capacitors connected in series between the seventh node and the eighth node; wherein the amplifier output is connected to the first and second compensation capacitors at a connection between the compensation capacitors and to the push-up and pull-down transistors at a connection between the push-up and pull-down transistors.

BRIEF DESCRIPTION OF THE DRAWINGS

These and/or other aspects and utilities of the present general inventive concept will become apparent and more readily appreciated from the following description of the embodiments, taken in conjunction with the accompanying drawings of which:

FIG. 11 illustrates a table showing a comparison between the amplifier of FIG. 1 and an amplifier including neither first control circuits nor second control circuits.

DETAILED DESCRIPTION OF THE EMBODIMENTS

Figure 1:
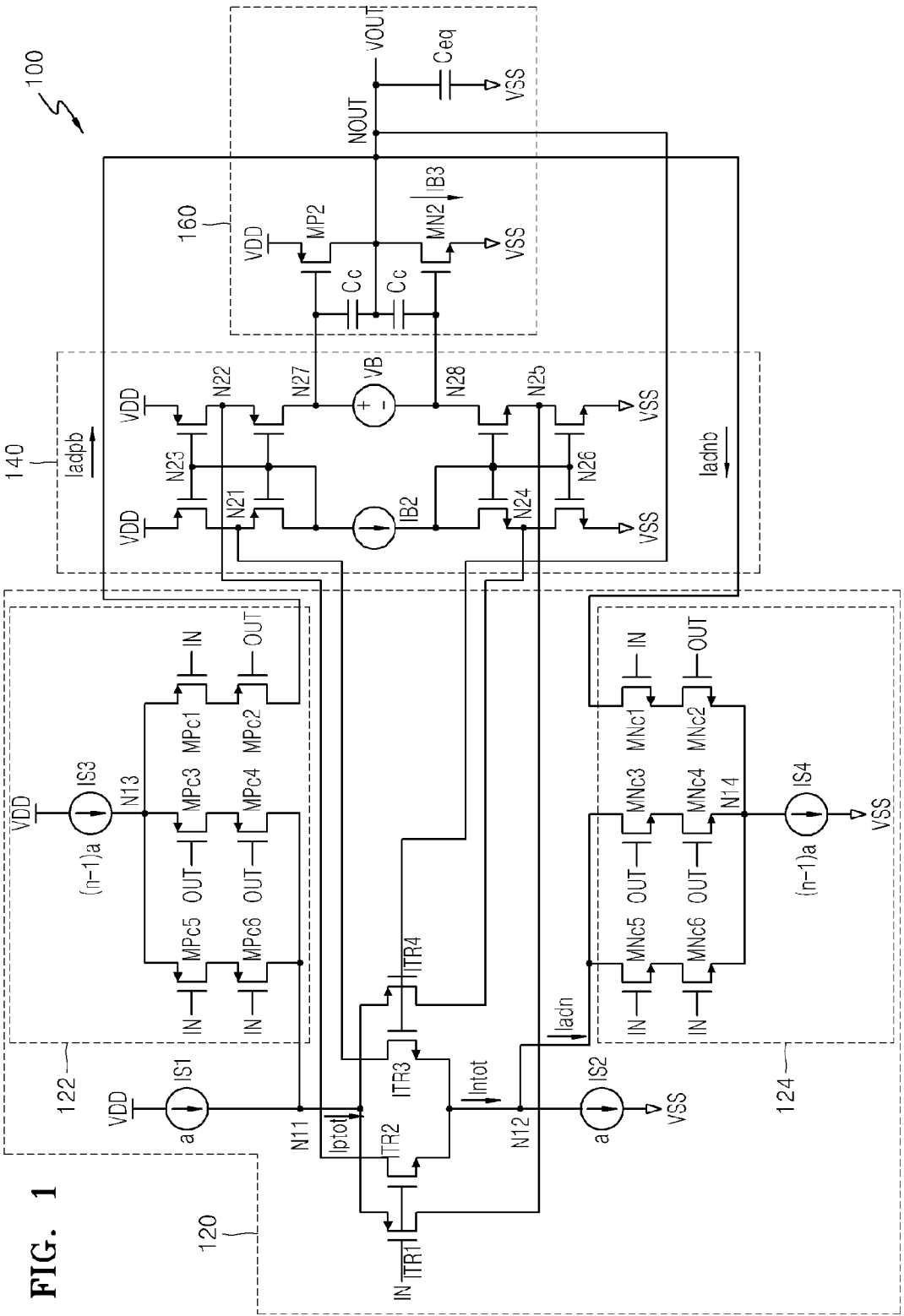
FIG. 1 is a circuit diagram of an amplifier according to an embodiment of the inventive concept.

Reference will now be made in detail to the embodiments of the present general inventive concept, examples of which are illustrated in the accompanying drawings, wherein like reference numerals refer to the like elements throughout. The embodiments are described below in order to explain the present general inventive concept by referring to the figures.

FIG. 1 is a circuit diagram of an amplifier 100 according to an embodiment of the inventive concept. Referring to FIG. 1, the amplifier 100 includes a first input unit 120, a second input unit 140, and an output unit 160.

The first input unit 120 transforms a voltage difference between an input IN and an output VOUT of the amplifier 100 into a current. The second input unit 140 controls the voltage levels of a ninth node N27 and a tenth node N28 that affect the voltage level of an output node NOUT, in response to a change in the current amount of the first input unit 120. The output unit 160 transmits a voltage of the output node NOUT as an output voltage, which varies according to a current controlled by the first and second input units 120 and 140.

The amplifier 100 may use a folded cascode operational transconductance amplifier (OTA) as an input terminal, namely, as the first and second input units 120 and 140. The folded cascode OTA denotes a circuit that transforms a voltage difference into a current.

The current generated to correspond to the voltage difference between the input IN and the output VOUT of the amplifier 100 controls the level of the voltage of the output node NOUT, and a detailed description thereof will be described in greater detail later.

The first input unit 120 includes a first control circuit 122 and a second control circuit 124. The first control circuit 122 divides a third bias current IS3 into two portions in a certain ratio and directs the two portions into the first input unit 120 and the output node NOUT, respectively. Similarly, the second control circuit 124 divides a fourth bias current IS4 into two portions in a certain ratio and directs the two portions out of the first input unit 120 and the output node NOUT, respectively.

The first and second control circuits 122 and 124 divide their corresponding bias currents in different ratios according to different operation modes of the amplifier 100. The first input unit 120 will now be described in greater detail with reference to FIGS. 2 through 5, which illustrate a circuit of the first input unit 120 and different operations thereof according to the different operational modes of the amplifier 100.

Figure 2:
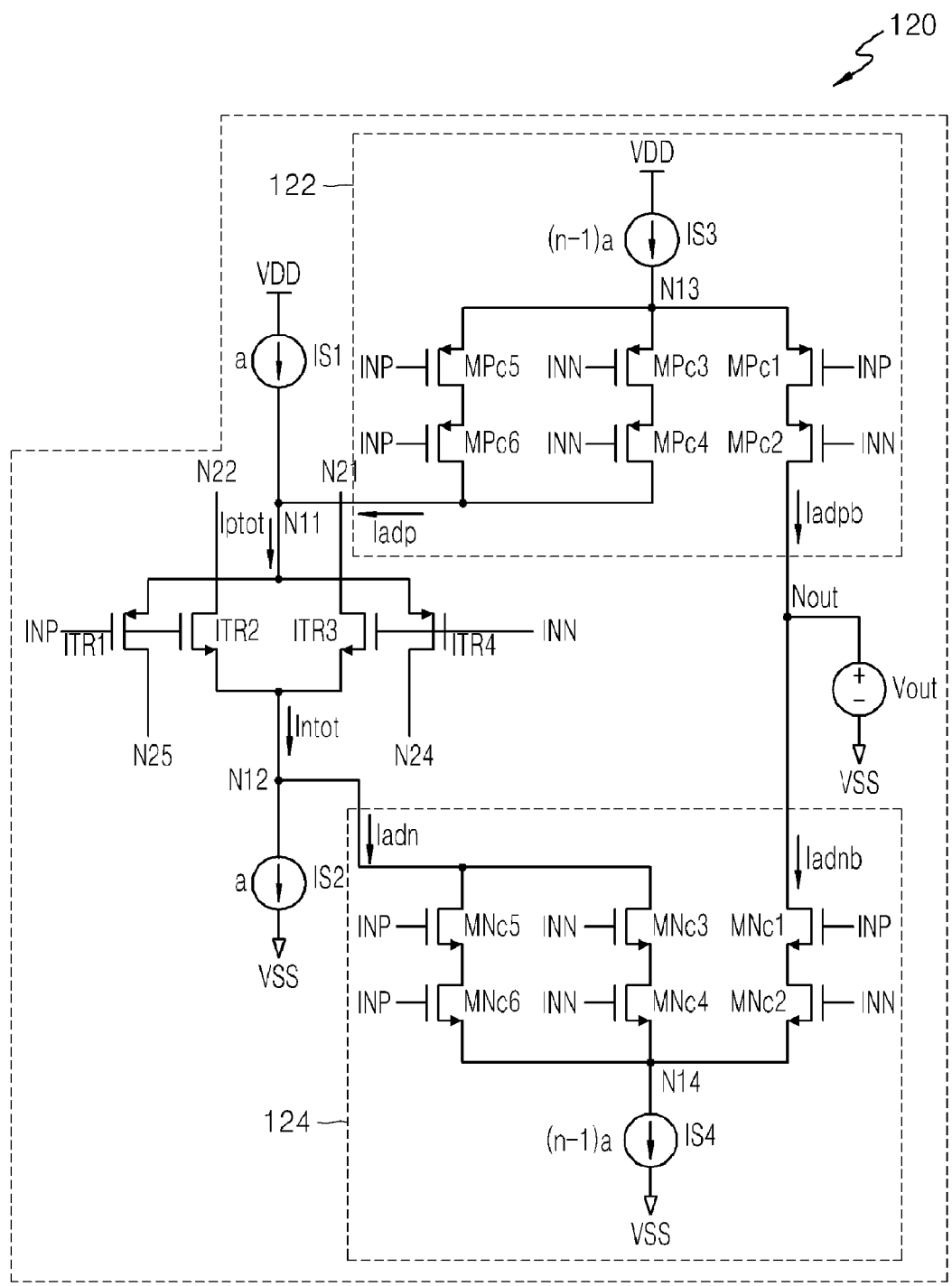
FIG. 2 is a circuit diagram of a first input unit included in the amplifier illustrated in FIG. 1.

FIG. 2 is a circuit diagram of the first input unit 120 included in the amplifier 100 illustrated in FIG. 1. Referring to FIG. 2, to transform the voltage difference between the input IN and the output VOUT of the amplifier 100 into the current as described above, the first input unit 120 includes a first input transistor ITR1 and a second input transistor ITR2 which are turned on in response to an input of the amplifier 100 (hereinafter, referred to as a first input signal INP), and a third input transistor ITR3 and a fourth input transistor ITR4 which are turned on in response to an output of the amplifier 100 (hereinafter, referred to as a second input signal INN).

The first and fourth input transistors ITR1 and ITR4 receive a first total current Iptot from a first node N11. A second total current Intot flows out of a second node N12 connected to the second and third input transistors ITR2 and ITR3.

A first bias current IS1 and a first control current Iadp are directed into the first node N11. In other words, the first total current Iptot has a current corresponding to a sum of the first bias current IS1 and the first control current Iadp. The first bias current IS1 is supplied from a current source disposed between a power supply voltage VDD and the first node N11, and has a current magnitude "a".

The first control current Iadp is supplied into the first node N11 by the first control circuit 122. The first control circuit 122 includes a plurality of transistors, namely, first through sixth control transistors MPc1 through MPc6. More specifically, a group of the serially-connected first and second control transistors MPc1 and MPc2 are connected between a third node N13 and the amplifier output. The third node N13 is connected to a third current source IS3. A group of the serially-connected third and fourth control transistors MPc3 and MPc4, and a group of the serially-connected fifth and sixth control transistors MPc5 and MPc6 are connected to one another in parallel between the third node N13 and the first node N11.

The magnitude of the first control current Iadp varies according to on/off operations of the first through sixth control transistors MPc1 through MPc6. The magnitude of the first total current Iptot varies according to the variation of the first control current Iadp.

A third bias current IS3 from a current source between the power supply voltage VDD and the thirteenth node N13 is divided into the first control current Iadp and a first control back-current Iadpb in a ratio that depends on the on/off operations of the first through sixth control transistors MPc1 through MPc6. When the first bias current IS1 has a magnitude "a", the third bias current IS3 may be set to have a magnitude "(n−1)*a", where n denotes an integer number greater than 1.

Since the first control back-current Iadpb flows into the output node NOUT, a voltage level Vout of the output node NOUT varies according to the on/off operations of the first through sixth control transistors MPc1 through MPc6. On/off conditions of the first through sixth control transistors MPc1 through MPc6, and a change of the voltage level Vout of the output node NOUT depending on the on/off conditions of the first through sixth control transistors MPc1 through MPc6 will be described in greater detail later.

Referring to FIG. 2, a second bias current IS2 and a second control current Iadn are directed out of the second node N12. In other words, the second total current Intot has a magnitude corresponding to a sum of the second bias current IS2 and the second control current Iadn. The second bias current IS2 is a current from a current source disposed between a ground voltage VSS and the second node N12, and has a magnitude "a", like the first bias current IS1.

The second control current Iadn is directed out of the second input transistor ITR2 and the third input transistor ITR3, namely, out of the second node N12, by the second control circuit 124.

The second control circuit 124 includes a plurality of transistors, namely, seventh through twelfth control transistors MNc1 through MNc6. The serially-connected seventh and eighth control transistors MNc1 and MNc2 are connected between a fourth node N14 and the amplifier output. The fourth node is connected to a current source IS4. The serially-connected ninth and tenth control transistors MNc3 and MNc4, and the serially-connected eleventh and twelfth control transistors MNc5 and MNc6 may be connected to one another in parallel between the second node N12 and the fourth node N14.

The magnitude of the second control current Iadn varies according to on/off operations of the seventh through twelfth control transistors MNc1 through MNc6. The magnitude of the second total current varies according to the variation of the second control current Iadn.

A fourth bias current IS4 of a current source between the ground voltage VSS and the fourth node N14 is divided into the second control current Iadn and a second control back-current Iadnb in a ratio that depends on the on/off operations of the seventh through twelfth control transistors MNc1 through MNc6. Similar to the third bias current IS3, the fourth bias current IS4 may be set to have a magnitude of "(n−1)*a", where n denotes an integer number greater than 1.

Since the second control back-current Iadnb flows out of the output node NOUT, the voltage level Vout of the output node NOUT varies according to the on/off operations of the seventh through twelfth control transistors MNc1 through MNc6. On/off conditions of the seventh through twelfth control transistors MNc1 through MNc6, and a change of the voltage Vout of the output node NOUT depending on the on/off conditions of the seventh through twelfth control transistors MNc1 through MNc6 will be described in greater detail later.

Figure 3:
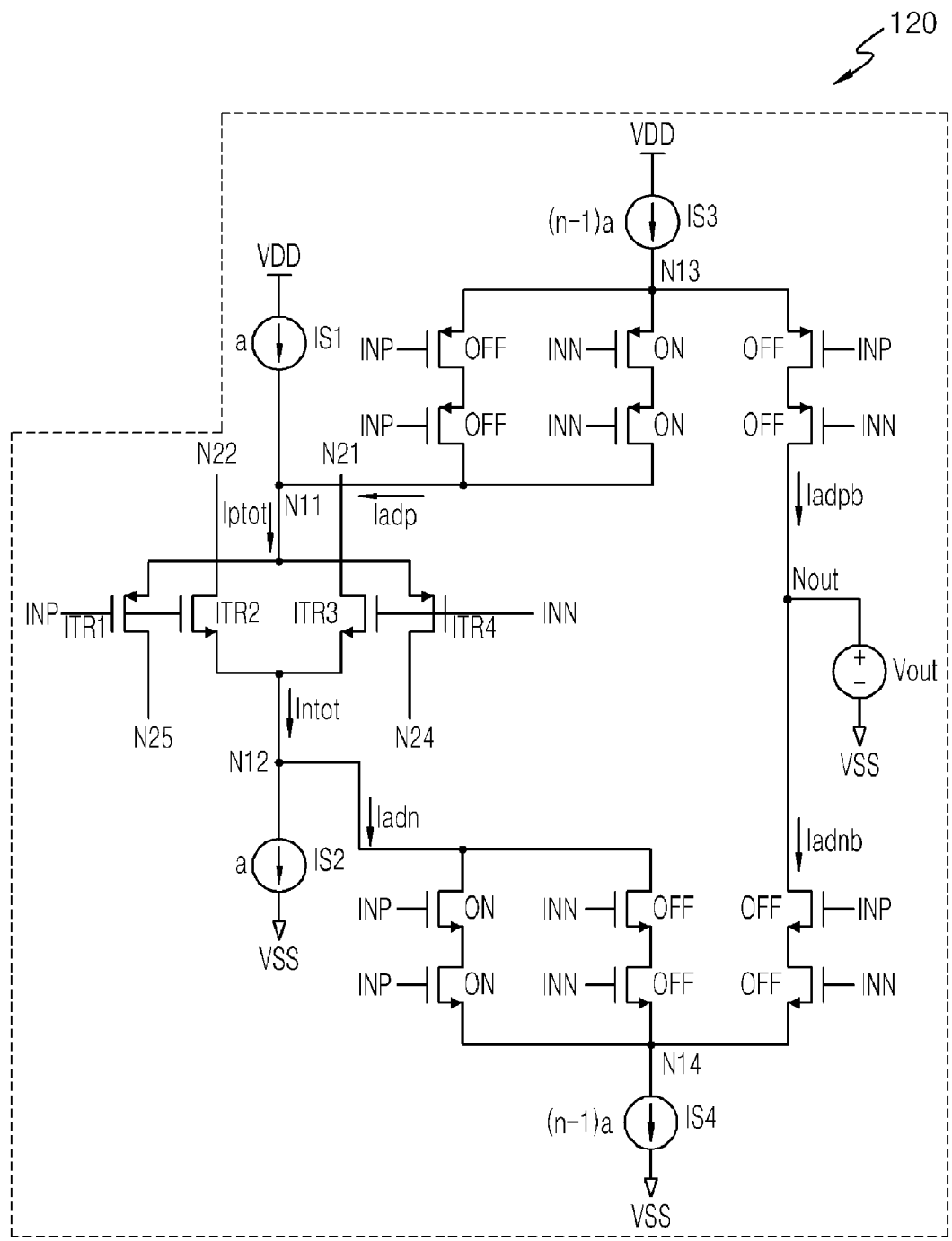
FIGS. 3 through 5 illustrate different operations of the first input unit of FIG. 2 in different operational modes of the amplifier illustrated in FIG. 1.
Figure 4:
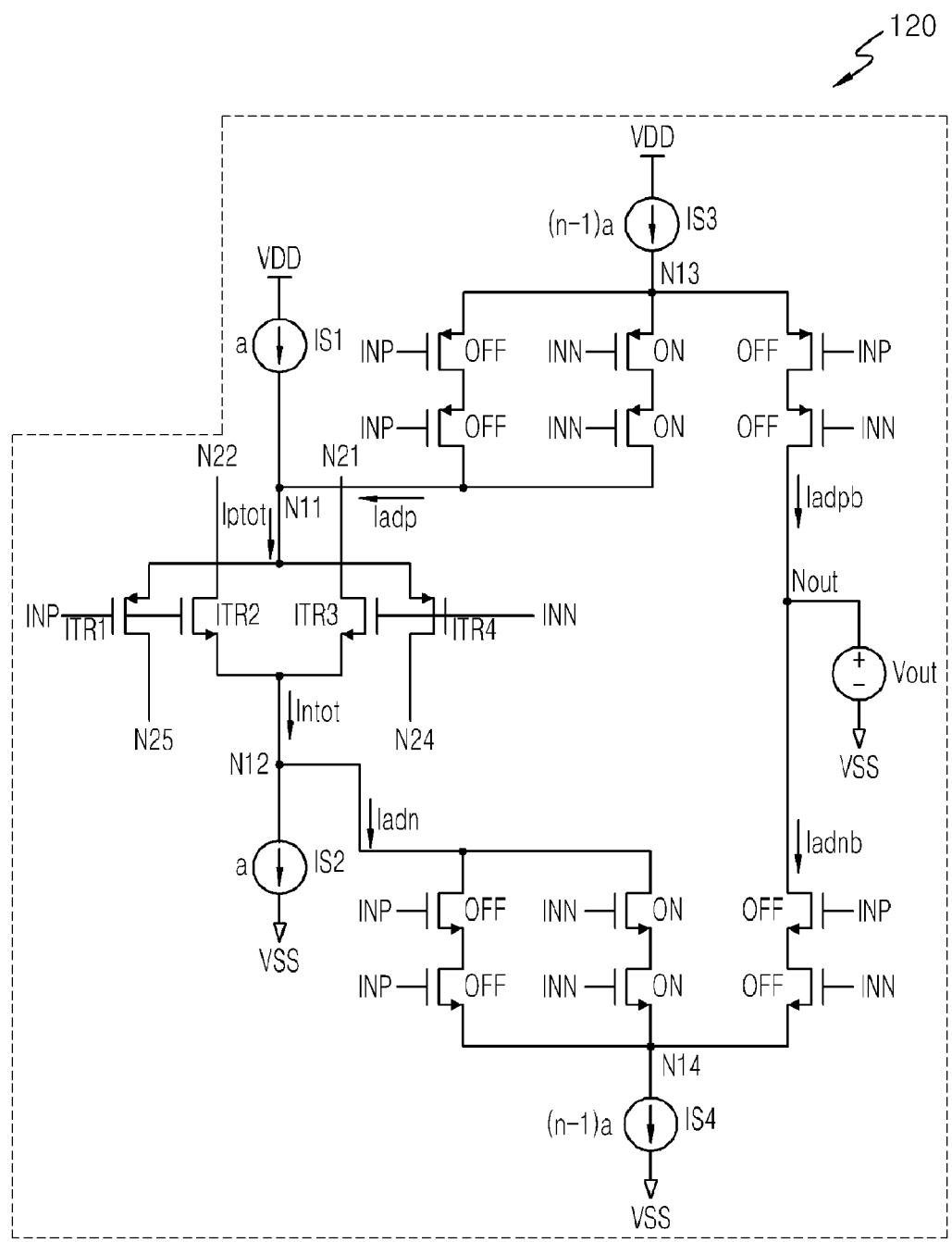
Figure 5:
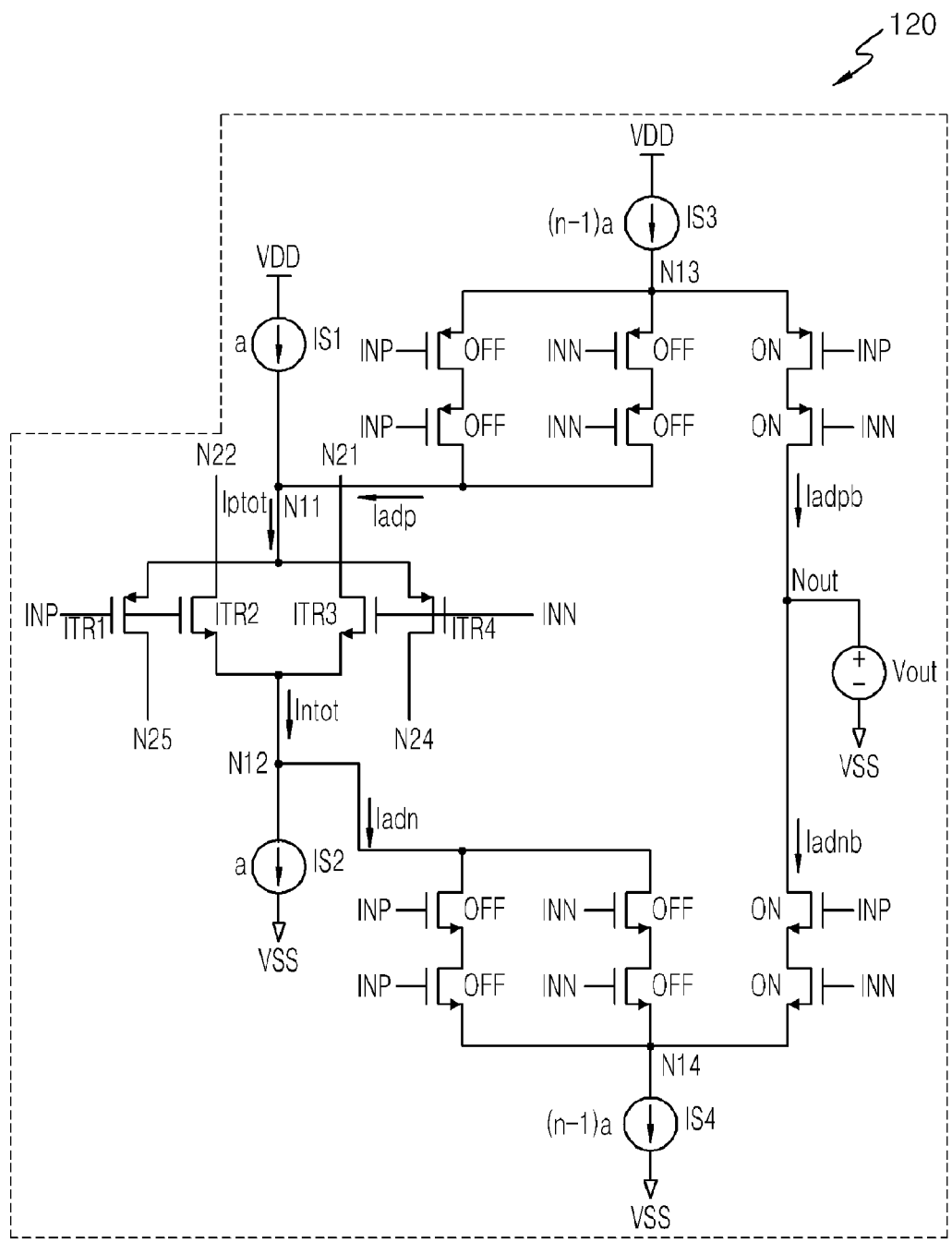

FIGS. 3 through 5 illustrate different operations of the first input unit 120 of FIG. 2 in different operational modes of the amplifier 100.

FIG. 3 is a circuit diagram illustrating an operation of the first input unit 120 of FIG. 2 in a first operational mode. The first operational mode denotes a case where a voltage level of the first input signal INP is greater than that of the second input signal INN. In other words, the first operational mode denotes a case where an input voltage of the amplifier 100 is greater than an output voltage thereof.

Referring to FIGS. 2 and 3, the first control transistor MPc1, the fifth control transistor MPc5, and the sixth control transistor MPc6 are gated by the first input signal INP, and the second control transistor MPc2, the third control transistor MPc3, and the fourth control transistor MPc4 are gated by the second input signal INN, corresponding to the output signal of the amplifier 100. All of the first through sixth control transistors MPc1 through MPc6 may be PMOS transistors, for example.

A voltage difference between the first input signal INP and the second input signal INN may be equal to or greater than a value capable of triggering the gating operations of transistors that receive the first and second input signals INP and INN. In addition, the output VOUT of the amplifier 100 may have a voltage level with which the first and second control transistors MPc1 and MPc2 and the seventh and eighth control transistors MNc1 and MNc2 can operate in a saturation region.

Accordingly, in the first operation mode, where the voltage level of the first input signal INP is greater than that of the second input signal INN, the first control transistor MPc1, the fifth control transistor MPc5, and the sixth control transistor MPc6 are turned off, and the third control transistor MPc3 and the fourth control transistor MPc4 are turned on. At this time, the second control transistor MPc2 is turned off because the first control transistor MPc1 is turned off. In other words, since no current passes through first control transistor MPc1, no current can pass through second control transistor MPc2.

Consequently, the first control back-current Iadpb flowing in the first control transistor MPc1 and the second control transistor MPc2 becomes "0" amps, and the first control current Iadp may have a magnitude "(n−1)*a" of the third bias current IS3. Leakage current and current consumed by the first through sixth control transistors MPc1 through MPc6 are not considered to determine the current of the first control current Iadp. Accordingly, the first total current Iptot flowing into the first node N11 is a sum of the first control current Iadp with a magnitude of "(n−1)*a" and the first bias current IS1 with a magnitude of "a", and thus the first total current Iptot may have a magnitude of "n*a".

The seventh control transistor MNc1, the eleventh control transistor MNc5, and the twelfth control transistor MNc6 are gated by the first input signal INP, and the eighth control transistor MNc2, the ninth control transistor MNc3, and the tenth control transistor MNc4 are gated by the second input signal INN. All of the seventh through twelfth control transistors MNc1 through MNc6 may be NMOS transistors.

Accordingly, in the first operational mode, where the voltage level of the first input signal INP is greater than that of the second input signal INN, the eleventh control transistor MNc5 and the twelfth control transistor MNc6 are turned on, and the eighth, ninth, and tenth control transistors MNc2, MNc3, and MNc4 are turned off. At this time, the seventh control transistor MNc1 is turned off because the eighth control transistor MNc2 is turned off. In other words, since no current passes through eighth control transistor MNc2, no current can pass through seventh control transistor MNc1.

Consequently, the second control back-current Iadnb flowing in the seventh and eighth control transistors MNc1 and MNc2 becomes "0" amps, and the second control current Iadn may have a magnitude of "(n−1)*a", based on the fourth bias current IS4. Leakage current and the current consumed by the seventh through twelfth control transistors MNc1 through MNc6 are not considered to determine the current of the second control current Iadn. Accordingly, the second total current Intot flowing out of the second node N12 is a sum of the second control current Iadn with a magnitude of "(n−1)*a" and the second bias current IS2 with a magnitude of "a", and thus the second total current Intot may have a magnitude of "n*a".

FIG. 4 is a circuit diagram illustrating an operation of the first input unit 120 of FIG. 2 in a second operational mode. The second operational mode denotes a case where the voltage level of the first input signal INP is smaller than that of the second input signal INN. In other words, the second operational mode denotes a case where the output voltage of the amplifier 100 is greater than the input voltage thereof.

Referring to FIGS. 2 and 4, the first control transistor MPc1, the fifth control transistor MPc5, and the sixth control transistor MPc6 are gated by the first input signal INP, and the second control transistor MPc2, the third control transistor MPc3, and the fourth control transistor MPc4 are gated by the second input signal INN. The first through sixth control transistors MPc1 through MPc6 may all be PMOS transistors, for example.

A voltage difference between the first input signal INP and the second input signal INN may be equal to or greater than the value that can differentiate the gating operations of the transistors that receive the first and second input signals INP and INN. In addition, the output voltage VOUT may have a voltage level with which the first and second control transistors MPc1 and MPc2 and the seventh and eighth control transistors MNc1 and MNc2 can operate in a saturation region.

Accordingly, in the second operation mode, where the voltage level of the first input signal INP is smaller than that of the second input signal INN, the fifth control transistor MPc5 and the sixth control transistor MPc6 are turned on, and the second, the third, and the fourth control transistors MPc2, MPc3, and MPc4 are turned off. At this time, the first control transistor MPc1 is turned off because the second control transistor MPc2 is turned off.

Consequently, the first control back-current Iadpb flowing in the first control transistor MPc1 and the second control transistor MPc2 becomes "0" amps, and the first control current Iadp may have a magnitude of "(n−1)*a", based on the third bias current IS3. Leakage current and the current consumed by the first through sixth control transistors MPc1 through MPc6 are not considered to determine the magnitude of the first control current Iadp. Accordingly, the first total current Iptot flowing into the first node N11 is a sum of the first control current Iadp with a magnitude of "(n−1)*a" and the first bias current IS1 with the a magnitude of "a", and thus the first total current Iptot may have a magnitude of "n*a".

The seventh control transistor MNc1, the eleventh control transistor MNc5, and the twelfth control transistor MNc6 are gated by the first input signal INP, and the eighth control transistor MNc2, the ninth control transistor MNc3, and the tenth control transistor MNc4 are gated by the second input signal INN. All of the seventh through twelfth control transistors MNc1 through MNc6 may be NMOS transistors, for example.

Accordingly, in the second operational mode, where the voltage level of the first input signal INP is smaller than that of the second input signal INN, the seventh, eleventh, and twelfth control transistors MNc1, MNc5, and MNc6 are turned off, and the ninth and tenth control transistors MNc3 and MNc4 are turned on. At this time, the eighth control transistor MNc2 is turned off because the seventh control transistor MNc1 is turned off.

Consequently, the second control back-current Iadnb flowing in the seventh and eighth control transistors MNc1 and MNc2 becomes "0" amps, and the second control current Iadn may have a magnitude of "(n−1)*a", based on the fourth bias current IS4. Leakage current and the current consumed by the seventh through twelfth control transistors MNc1 through MNc6 are not considered to determine the magnitude of the second control current Iadn. Accordingly, the second total current Intot flowing out of the second node N12 is a sum of the second control current Iadn with a magnitude of "(n−

1)*a" and the second bias current IS2 with a magnitude of "a", and thus the second total current Intot may have a magnitude of "n*a".

FIG. 5 is a circuit diagram illustrating an operation of the first input unit 120 of FIG. 2 in a third operational mode. The third operational mode denotes a case where the voltage level of the first input signal INP is the same as that of the second input signal INN. In other words, the third operational mode denotes a case where the output voltage of the amplifier 100 is the same as the input voltage thereof. The third operational mode may also describe a situation in which the voltage level of the first input signal INP is only slightly different from that of the second input signal INN.

Referring to FIGS. 2 and 5, the first control transistor MPc1, the fifth control transistor MPc5, and the sixth control transistor MPc6 are gated by the first input signal INP, and the second control transistor MPc2, the third control transistor MPc3, and the fourth control transistor MPc4 are gated by the second input signal INN. The first through sixth control transistors MPc1 through MPc6 may all be PMOS transistors, for example.

The output voltage VOUT may have a voltage level with which the first and second control transistors MPc1 and MPc2 and the seventh and eighth control transistors MNc1 and MNc2 can operate in a saturation region. It is also assumed that the sizes of the first and second control transistors MPc1 and MPc2 are greater than those of the third through sixth transistors MPc3 through MPc6.

Accordingly, in the third operation mode, where the voltage level of the first input signal INP is the same as that of the second input signal INN, the third bias current IS3 flows into the first and second control transistors MPc1 and MPc2, and does not flow into the third through sixth control transistors MPc3 through MPc6.

Consequently, the first control back-current Iadpb flowing in the first control transistor MPc1 and the second control transistor MPc2 has a magnitude of "(n−1)*a", based on the third bias current IS3, and the first control current Iadp becomes "0" amps. Leakage current and the current consumed by the first through sixth control transistors MPc1 through MPc6 are not considered to determine the magnitude of the first control current Iadp. Accordingly, the first total current Iptot flowing into the first node N11 is a sum of the first control current Iadp with the magnitude of 0 amps and the first bias current IS1 with the magnitude of "a", and thus the first total current Iptot may have a magnitude of "a".

The sizes of the seventh and eighth control transistors MNc1 and MNc2 may be sufficiently greater than those of the ninth through twelfth transistors MNc3 through MNc6.

Accordingly, in the third operational mode, where the voltage level of the first input signal INP is the same as that of the second input signal INN, the second control back-current Iadnb having the same magnitude as the fourth bias current IS4 flows into the seventh and eighth control transistors MNc1 and MNc2, and does not flow into the ninth through twelfth control transistors MNc3 through MNc6.

Consequently, the second control back-current Iadnb flowing in the seventh and eighth control transistors MNc1 and MNc2 has a magnitude of "(n−1)*a", as the fourth bias current IS4, and the second control current Iadn becomes "0" amps. Leakage current and the current consumed by the seventh through twelfth control transistors MNc1 through MNc6 are not considered to determine the magnitude of the second control current Iadn. Accordingly, the second total current Intot flowing out of the second node N12 is a sum of the second control current Iadn with the magnitude of "0" amps and the second bias current IS2 with the magnitude of "a", and thus the second total current Intot may have a magnitude of "a".

Figure 6A:
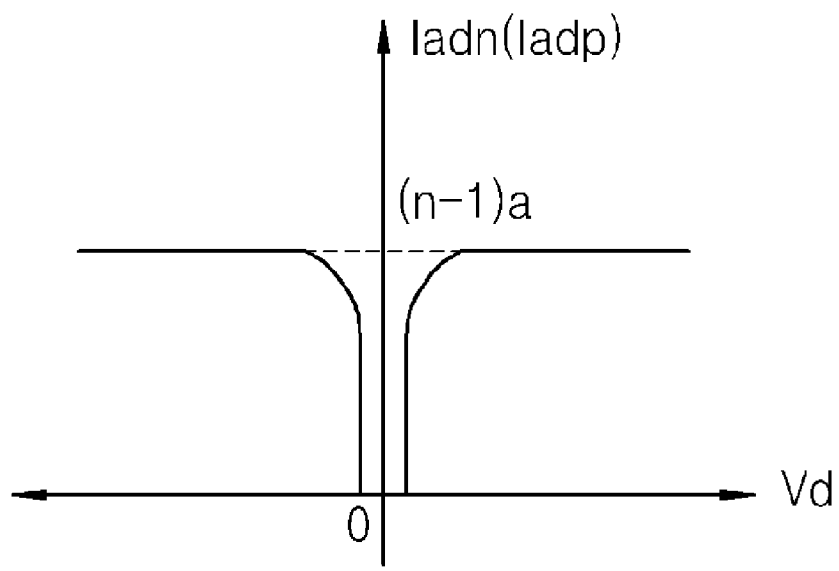
FIGS. 6A and 6B are graphs showing first and second control currents and first and second total currents that depend on the operational modes illustrated in FIGS. 3 through 5.
Figure 6B:
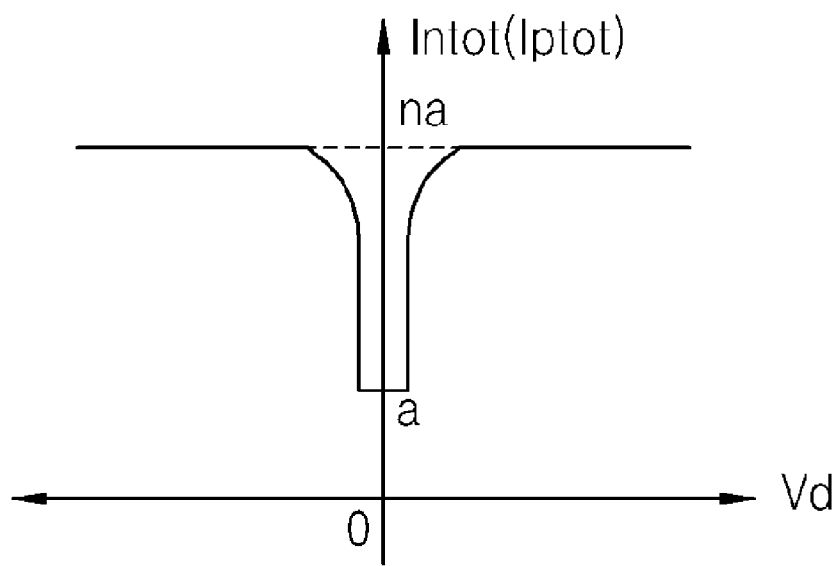

FIGS. 6A and 6B are graphs showing the first and second control currents Iadp and Iadn and the first and second total currents Iptot and Intot that depend on the first through third operational modes illustrated in FIGS. 3 through 5.

Referring to FIG. 6A, the first control current Iadp and the second control current Iadn, depending on a difference Vd between the input and output voltages of the amplifier 100, have the same values as described above with reference to FIGS. 3 through 5. In other words, the first control current Iadp and the second control current Iadn have current amounts of "(n−1)*a" in the first operation mode of FIG. 3 where the difference "Vd" has a positive value and in the second operation mode of FIG. 4 where the difference "Vd" has a negative value, and the first control current Iadp and the second control current Iadn have current amounts of "0" amps in the third operation mode of FIG. 5 where the difference "Vd" is "0" volts.

Referring to FIG. 6B, the first and second total currents Iptot and Intot, depending on a difference Vd between the input and output voltages of the amplifier 100, have the same values as described above with reference to FIGS. 3 through 5. In other words, the first and second total currents Iptot and Intot have magnitudes of "n*a" in the first operation mode of FIG. 3 where the difference "Vd" has a positive value and in the second operation mode of FIG. 4 where the difference "Vd" has a negative value, and the first and second total currents Iptot and Intot have magnitudes of "a" in the third operation mode of FIG. 5 where the difference "Vd" is "0" volts.

Figure 7:
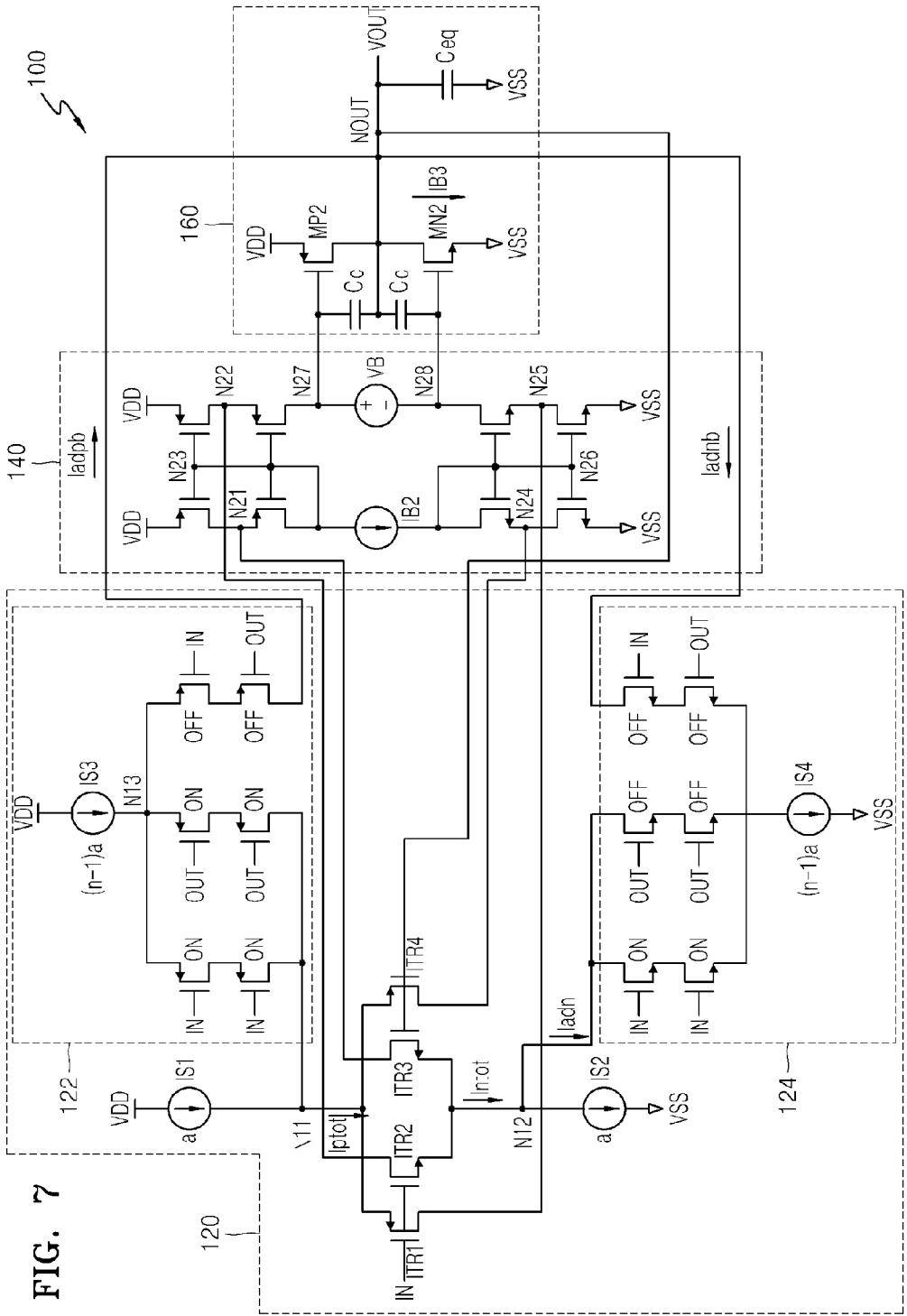
FIGS. 7 through 9 illustrate different operations of the amplifier of FIG. 1 in the operational modes illustrated in FIGS. 3 through 5.
Figure 8:
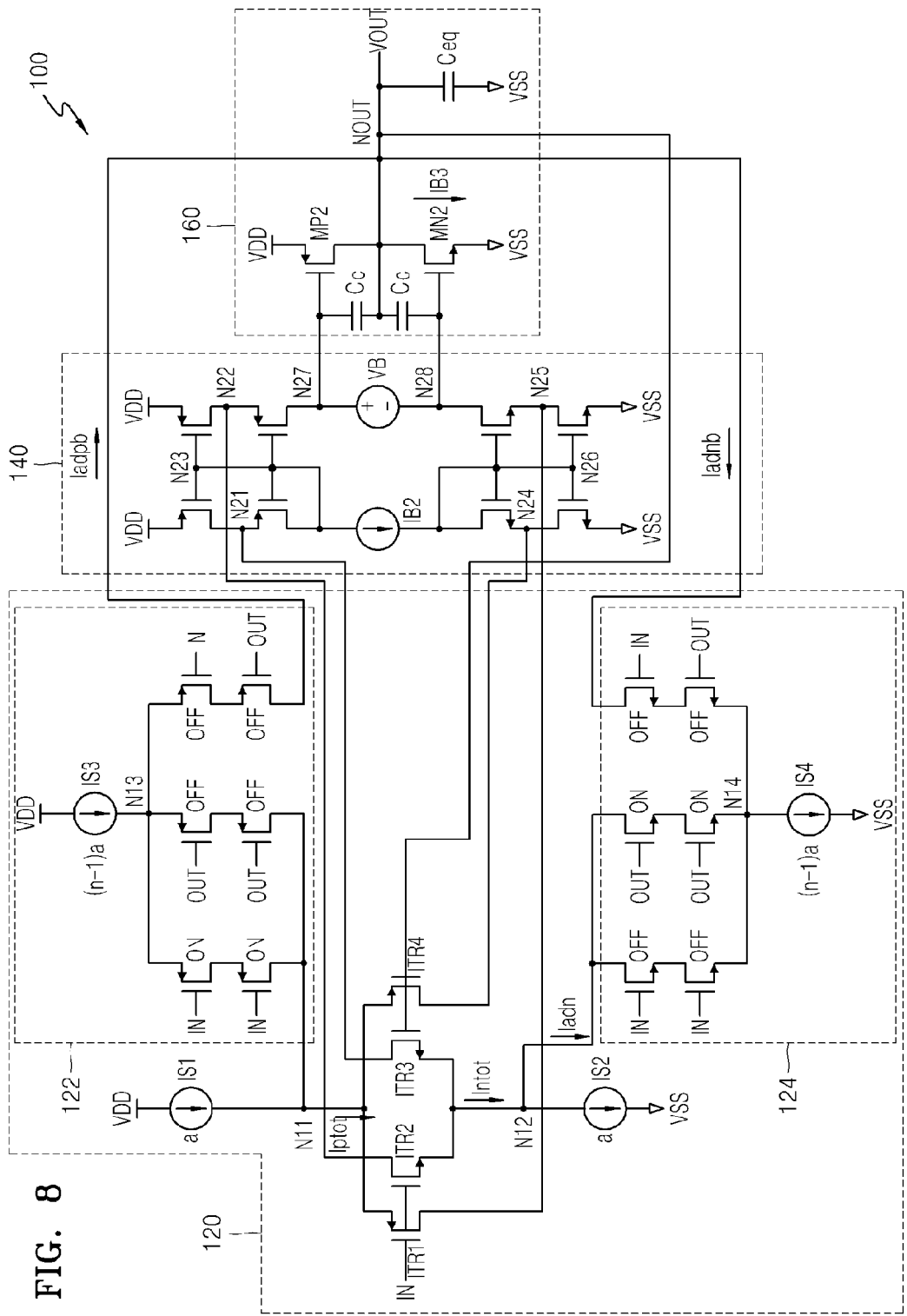
Figure 9:
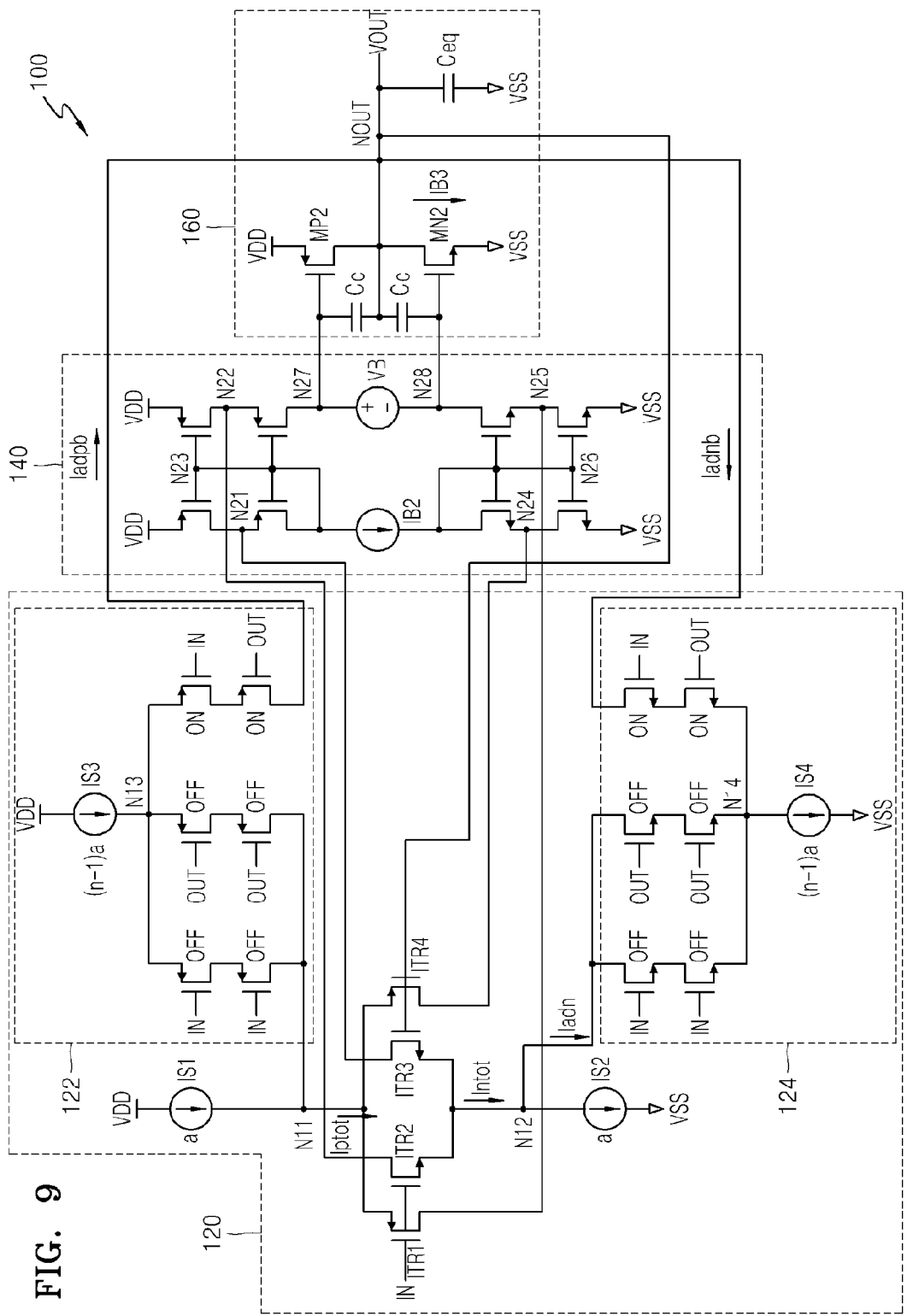

FIGS. 7 through 9 illustrate different operations of the amplifier 100 of FIG. 1 in the first, second, and third operational modes illustrated in FIGS. 3 through 5.

FIG. 7 illustrates an operation of the amplifier 100 in the first operational mode of FIG. 3. Referring to FIGS. 3 and 7, in the first operational mode where the voltage level of the first input signal INP is greater than that of the second input signal INN, the second input transistor ITR2 gated by the first input signal INP sends greater current toward the ground voltage VSS than that by the third input transistor ITR3 gated by the second input signal INN.

Accordingly, the voltage level of a sixth node N22 of the second input unit 140 is lower than that of a seventh node N21 thereof. According to a change in the voltage level of the sixth node N22, the voltage level of the ninth node N27 decreases.

The output unit 160 may include a pull-up transistor MP2 and a pull-down transistor MN2. The pull-up transistor MP2 includes a first terminal connected to the power supply voltage VDD, a gate connected to the ninth node N27, and a second terminal connected to the output node NOUT. The pull-down transistor MN2 includes a first terminal connected to the output node NOUT, a gate connected to a tenth node N28, and a second terminal connected to the ground voltage VSS.

The degrees to which the pull-up transistor MP2 and the pull-down transistor MN2 are turned on are controlled by the ninth node N27 and the tenth node N28, thereby controlling the output voltage VOUT of the amplifier 100. As described above, in the first operational mode, when the voltage level of the ninth node N27 decreases, the pull-up transistor MP2 is turned on so that a voltage is applied from the power supply voltage VDD to the output node NOUT. The voltage of the output node NOUT, that is, the output voltage VOUT, is equal to a voltage for an equivalent output load capacitance Ceq.

At this time, as described above, the first control circuit 122 and the second control circuit 124 are in the same states, as those shown in FIG. 3, in the first operational mode, and thus the first total current Iptot and the second total current Intot may have magnitudes of "n*a". Compensation capacitors $Cc_1$ and $Cc_2$ of the output unit 160 have identical capacitance values and are serially connected between the ninth and tenth nodes N27 and N28, and thus a slew-rate of the amplifier 100 may be "n*a/Cc".

As such, the amplifier 100 may operate at a high slew rate in the first operational mode.

FIG. 8 illustrates an operation of the amplifier 100 in the second operational mode. Referring to FIGS. 4 and 8, in the second operational mode where the voltage level of the first input signal INP is lower than that of the second input signal INN, a current provided to a fifth node N25 connected to the first input transistor ITR1 is greater than a current provided to an eighth node N24 connected to the fourth input transistor ITR4 gated by the second input signal INN.

Accordingly, the voltage level of the fifth node N25 is higher than that of the eighth node N24. According to a change in the voltage level of the fifth node N25, the voltage level of the tenth node N28 increases.

In the second operational mode, when the voltage level of the tenth node N28 increases, the pull-down transistor MN2 is turned on so that a voltage is applied from the ground voltage VSS to the output node NOUT.

At this time, as described above, the first control circuit 122 and the second control circuit 124 are in the same states, as those shown in FIG. 4, in the second operational mode, and thus the first total current Iptot and the second total current Intot may have magnitudes of "n*a". Accordingly, the slew rate of the amplifier 100 may be "n*a/Cc".

FIG. 9 illustrates an operation of the amplifier 100 in the third operational mode. Referring to FIGS. 5 and 9, in the third operational mode (that is, a steady-state) where the voltage levels of the first and second input signals INP and INN are the same as each other, the first and second control circuits 122 and 124 are in the same states, as shown in FIG. 5, and thus the first total current Iptot and the second total current Intot have magnitudes of "a", and the first control current Iadp and the second control current Iadn have magnitudes of "0".

Therefore, the bias current of the first input unit 120 in the third operational mode is the first bias current IS1, which is only "a". Thus, although the slew rate is increased to "n*a/Cc", a bias current IB2 of the second input unit 140 and a quiescent current IB3 do not need to be increased.

Accordingly, a current consumed by the amplifier 100 may be represented by the following equation:

$$I_{totinv1}=a+(n-1)a+2(a/2+b)+c(n+1)a+2b+c \qquad \text{Equation (a):}$$

In other words, as illustrated in Equation (a), the current $I_{totinv1}$ is a sum of bias currents "a" and "(n−1)*a" of the first input unit 120, bias currents "2*(a/2+b)" of a current source and a voltage source of the second input unit 140, and a quiescent current "c" of the output unit 160.

The second input unit 140 further includes a current source connected between the eleventh node N23 and the twelfth node N26 that supplies a bias current IB2, and a voltage source connected between the ninth node N27 and the tenth node N28 that supplies a bias voltage VB. The eleventh node N23 and the twelfth node N26 are further connected to respective gates of the transistors of the second input unit. Since the bias current IB2 of the second input unit 140 needs to be greater than the first bias current IS1, the bias current IB2 may be expressed as "a/2+b(b>0)".

The size of the quiescent current IB3 of the output unit 160 flowing from the output node NOUT to the ground voltage VSS is referred to as "c". The quiescent current IB3 denotes a current which flows from the power supply voltage VDD of the output unit 160 to the ground voltage VSS of the output unit 160 when the amplifier 100 is in a static state, since the voltage levels of the input signals INP and INN are the same as each other.

In general, the slew rate of a class-AB folded cascode amplifier is proportional to a bias current (i.e., IS1+IS3 or IS2+IS4) of the first input unit 120. However, in contrast with the amplifier 100, in an amplifier having neither first control circuits nor second control circuits, in order for the slew rate to be increased to "n*a/Cc", that is, increased by approximately n times, the bias current (i.e., IS1 or IS2 under the assumption that neither first control circuits nor second control circuits exist) of a first input unit needs to be increased by n times, and a bias current of a second input unit and a quiescent current of an output unit must also increase in proportion to n.

More specifically, a current $I_{totcon}$ consumed by the amplifier having neither first control circuits nor second control circuits is as shown in the following equation:

$$I_{totcon}=IB1'+2IB2'+IB3'=2na+2\eta b+(\sqrt{n})\cdot c \qquad \text{Equation (b):}$$

Here, a first bias current IS1 (=IB1) required to increase the slew rate by approximately n times such as "n*a/Cc" is referred to as IB1', the bias current IB2 of the second input unit is referred to as IB2', and the quiescent current IB3 is referred to as IB3'.

As described above, in order to increase the slew rate of an amplifier by n times when the amplifier includes neither first control circuits nor second control circuits, IB1' needs to be "n*a", which is n times the first bias current IB1 of "a". Thus, since the bias current IB2 of the second input unit is "a/2+b", IB2' needs to be "(n*a)/2+η*b", where η has an arbitrary number equal to or greater than 1.

Since an open-loop gain of the amplifier having neither first nor second control circuits is proportional to $\sqrt{IS1}$, which is the root of the first bias current IS1, the open-loop gain increases by $\sqrt{n}$ times. However, when the open-loop gain increases, a phase margin decreases. Thus, in order to increase the slew rate by n times without varying the phase margin, IB3' needs to be "$\sqrt{n}$*c", which is $\sqrt{n}$ times the quiescent current IB3 of "c".

In other words, in the amplifier having neither first nor second control circuits, the current $I_{totcon}$ consumed when the slew rate is increased n times has a value as shown in Equation (b). On the other hand, the current $I_{totinv1}$ consumed in the amplifier 100 has a value as shown in Equation (a).

A magnitude of current reduced by using an amplifier 100 instead of a conventional amplifier may be represented by a value, "$I_{save}$." Since $\sqrt{n}$ and In are both greater than 1 as described above, $I_{save}$ has always a positive value. Accordingly, the amplifier 100 may reduce current consumption by an amount "$I_{save}$" expressed in the following equation:

$$I_{save}=I_{totcon}-I_{totinv1}=(n-1)a+2(\eta-1)b+((\sqrt{n})-1)c \qquad \text{Equation (c):}$$

Therefore, the amplifier 100 may reduce the power consumed compared to an amplifier without a first or second control unit.

Figure 10:
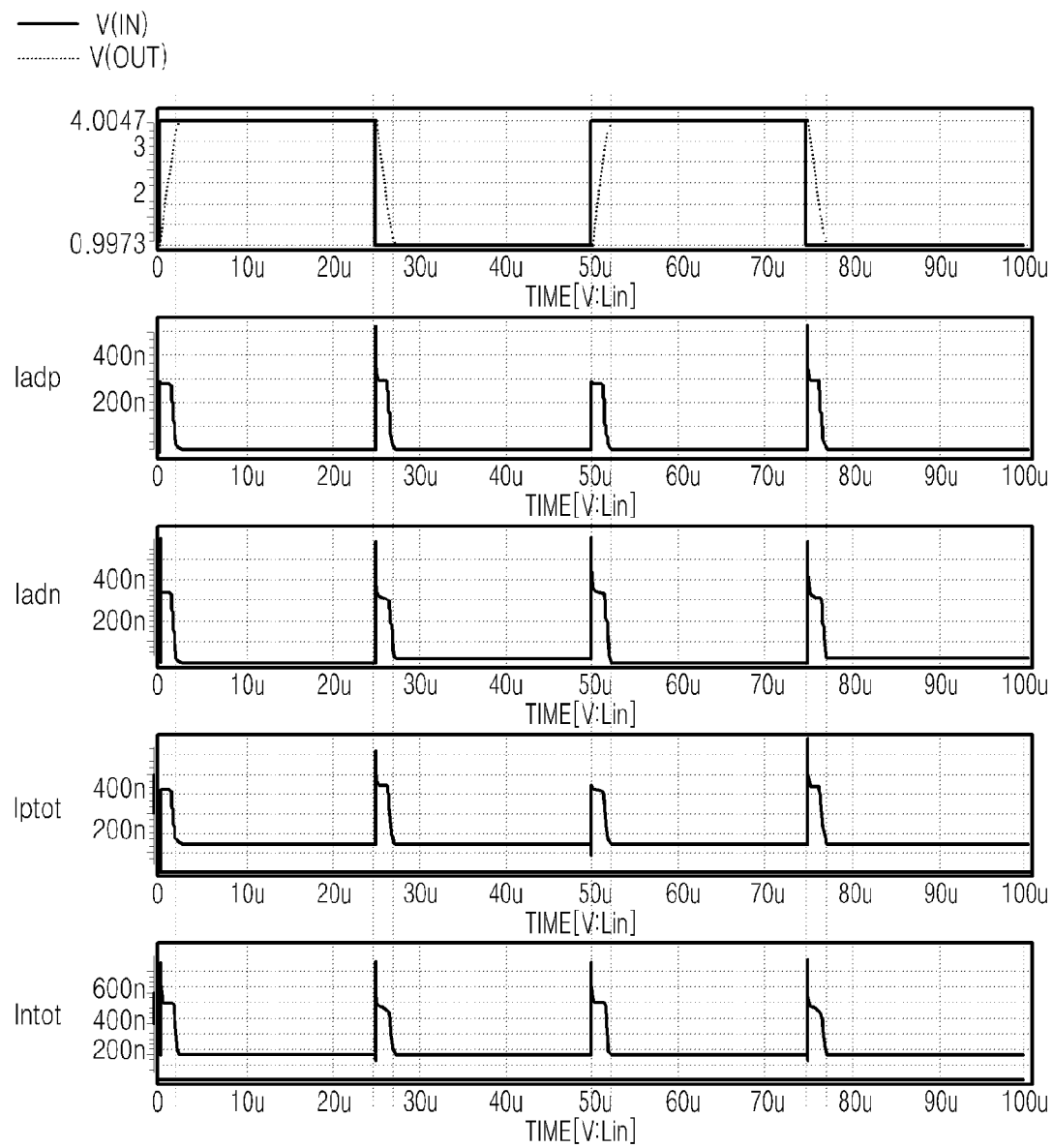
FIG. 10 shows results of a simulation performed on the amplifier of FIG. 1.

FIG. 10 shows results of a simulation performed on the amplifier 100. FIG. 11 illustrates a table showing a comparison between the amplifier 100 according to the embodiment of FIG. 1 and an amplifier including neither first control circuits nor second control circuits.

Referring to FIG. 10, when the input voltage V(IN) and the output voltage V(OUT) of the amplifier 100 are different from each other, currents Iadp, Iadn, Iptot, and Intot rapidly reflect the difference in V(IN) and V(OUT) with an increase in current. On the other hand, when the input voltage V(IN) and the output voltage V(OUT) of the amplifier 100 are equal to each other, the amplifier 100 operates with low current.

Therefore, as illustrated in FIG. 11, the amplifier 100 ("present op-amp") consumes less current than the amplifier including neither first control circuits nor second control circuits (a "conventional op-amp"), thereby reducing power consumption. FIG. 11 shows results of an experiment in which a slew rate was 0.81V/µs and n was 3. A conventional op-amp having neither a first nor a second control unit operated an HVGA source driver. As shown in FIG. 11, the op-amp of the present general inventive concept consumes less current operating at one amp and when operating an HVGA source driver.

While the inventive concept has been particularly shown and described with reference to exemplary embodiments thereof, it will be understood that various changes in form and details may be made therein without departing from the spirit and scope of the following claims.

Although a few embodiments of the present general inventive concept have been shown and described, it will be appreciated by those skilled in the art that changes may be made in these embodiments without departing from the principles and spirit of the general inventive concept, the scope of which is defined in the appended claims and their equivalents.

What is claimed is:

1. A folded cascode amplifier including a class-AB input terminal, the amplifier comprising:
    a first input unit to receive a first an A bias current, to transform a difference between an input voltage and an output voltage of the amplifier into a corresponding intermediate current, and comprising a plurality of input transistors;
    a second input unit to receive the intermediate current and a B bias current and to control a voltage output from the second input unit in response to a change in the intermediate current from the first input unit; and
    an output unit to output an output voltage to an output node controlled by an output control unit which receives the output voltage of the second input unit, and to generate a quiescent current to flow from the output control unit to a ground voltage source,
    wherein the first input unit comprises a first control circuit and a second control circuit each comprising one terminal connected to the output node and another terminal connected to a respective input transistor from among the plurality of input transistors, and
    wherein each of the first and second control circuits controls a current flowing into the plurality of input transistors and out of the plurality of input transistors, according to respective operating modes of the amplifier, whereby the B bias current and the quiescent current do not increase even when the A bias current is increased to increase a slew rate of the amplifier.

2. The amplifier of claim 1, wherein:
    the first input unit comprises:
    a first current source connected to a power supply voltage and a first node of the first input unit to supply a first bias current to the first node;
    a second current source connected to a ground voltage source and a second node of the first input unit to direct a second bias current out of the second node; and
    the plurality of input transistors each comprising one terminal connected to one of the first and second nodes, another terminal connected to the second input unit, and a gate terminal to receive one of the input voltage and the output voltage.

3. The amplifier of claim 2, wherein the first control circuit comprises:
    a third current source connected to a power supply voltage and a third node and to supply a third bias current to the third node, wherein the third bias current is greater than the first bias current by (n−1) times, where n denotes a natural number equal to or greater than 2;
    a first control transistor and a second control transistor connected between the third node and the output node and serially connected to each other, wherein a gate terminal of the first control transistor receives either one of the input voltage or the output voltage, and a gate terminal of the second control transistor receives the other one of the input voltage and the output voltage;
    a third control transistor and a fourth control transistor serially connected to each other between the first node and the third node, gates of both the third and fourth control transistors receiving either the input voltage or the output voltage; and
    a fifth control transistor and a sixth control transistor serially connected to each other and connected in parallel with the third control transistor and the fourth control transistor, gates of the fifth and sixth control transistors receiving one of the input voltage or the output voltage different than the voltage received by the gates of the third and fourth control transistors.

4. The amplifier of claim 3, wherein at least one of the first through sixth control transistors comprises a plurality of control circuits.

5. The amplifier of claim 2, wherein the second control circuit comprises:
    a fourth current source connected to a ground voltage source and a fourth node to direct a fourth bias current out of the fourth node, wherein the fourth bias current is (n−1) times greater than the first bias current, where n denotes a natural number equal to or greater than 2;
    a seventh control transistor and an eighth control transistor serially connected to each other between the fourth node and the output node, wherein the seventh control transistor receives at its gate one of the input voltage or the output voltage and the eighth control transistor receives at its gate the other of the input voltage and the output voltage;
    a ninth control transistor and a tenth control transistor serially connected to each other between the second node and the fourth node, gates of the ninth and tenth control transistors receiving one of the input voltage or the output voltage; and
    an eleventh control transistor and a twelfth control transistor connected serially to each other and in parallel with the ninth control transistor and the tenth control transistor, gates of the eleventh and twelfth control transistors receiving one of the input voltage and the output voltage different than the voltage received at the gates of the ninth and tenth control transistors.

6. The amplifier of claim 5, wherein at least one of the seventh through twelfth control transistors comprises a plurality of control circuits.

7. The amplifier of claim 2, wherein the input transistors comprise:

a first input transistor having one terminal connected to the first node, another terminal connected to a fifth node of the second input unit, and a gate to receive the input voltage;

a second input transistor having one terminal connected to the second node, another terminal connected to a sixth node of the second input unit, and a gate to receive the input voltage;

a third input transistor having one terminal connected to the second node, another terminal connected to a seventh node of the second input unit, and a gate to receive the output voltage; and a fourth input transistor having one terminal connected to the first node, another terminal connected to an eighth node of the second input unit, and a gate to receive the output voltage.

8. The amplifier of claim 7, wherein the output control unit of the output unit comprises a pull-up transistor and a pull-down transistor serially connected to each other between the power supply voltage and the ground voltage, and when the input voltage is greater than the output voltage, the sixth node lowers a node voltage of a ninth node of the second input unit, which supplies a voltage to a gate of the pull-up transistor.

9. The amplifier of claim 7, wherein the output control unit of the output unit comprises a pull-up transistor and a pull-down transistor serially connected to each other between the power supply voltage and the ground voltage, and when the input voltage is smaller than the output voltage, the fifth node raises a node voltage of a tenth node of the second input unit, which supplies a voltage to a gate of the pull-down transistor.

10. The amplifier of claim 7, wherein when the input voltage is the same as the output voltage, the voltage of the sixth node and the voltage of the fifth node do not change.

11. An amplifier, comprising:

a first input unit to receive a first voltage and convert the first voltage into a first current, the input unit comprising:

a plurality of input transistors;

a first control unit comprising:
a plurality of first control transistors connected between a first current source and a first input transistor; and
a plurality of second control transistors connected between the first current source and an output of the amplifier; and a second control unit comprising:
a plurality of third control transistors connected between a second current source and a second input transistor; and
a plurality of fourth control transistors connected between the second current source and the output of the amplifier;

a second input unit to receive the first current from the first input unit and to convert the first current into a second voltage; and an output unit to receive the second voltage from the second input unit and to convert the second voltage into an output voltage.

12. The amplifier according to claim 11, wherein the first input unit further comprises:

a third current source connected to a first node between the first control unit and the plurality of input transistors; and a fourth current source connected to a second node between the second control unit and the plurality of input transistors.

13. The amplifier according to claim 11, wherein the plurality of first control transistors of the first control unit comprise at least first and second rows of transistors connected in series, source-to-drain, the rows connected in parallel with each other;

each transistor of the first row has a gate connected to an input voltage of the amplifier;

each transistor of the second row has a gate connected to an output voltage of the amplifier;

a source of a transistor at one end of each of the first and second rows is connected to the first current source, and a drain of a transistor at the other end of each of the first and second rows is connected to the first node of the first input unit; and the plurality of second control transistors comprises a third row of transistors comprising a first transistor having a gate connected to the input voltage of the amplifier and a second transistor having a gate connected to the output voltage of the amplifier, a source of a transistor at one end of the third row is connected to the first current source, and a drain of a transistor at the other end of the third row is connected to the output of the amplifier.

14. The amplifier according to claim 13, wherein the plurality of third control transistors of the first control unit comprise at least fourth and fifth rows of transistors connected in series, source-to-drain, the rows connected in parallel with each other;

each transistor of the fourth row has a gate connected to an input voltage of the amplifier, each transistor of the fifth row has a gate connected to an output voltage of the amplifier, a source of a transistor at one end of each of the fourth and fifth rows is connected to the second current source, and a drain of a transistor at the other end of each of the fourth and fifth rows is connected to the second node of the first input unit; and the plurality of fourth control transistors comprises a sixth row of transistors comprising a first transistor having a gate connected to the input voltage of the amplifier and a second transistor having a gate connected to the output voltage of the amplifier, a source of a transistor at one end of the sixth row is connected to the second current source, and a drain of a transistor at the other end of the sixth row is connected to the output of the amplifier.

15. The amplifier according to claim 11, wherein the plurality of first input transistors comprise:

a first input transistor having a gate, a source, and a drain, the gate being connected to an input voltage source, the source of the first input transistor being connected to one of the first node of the first input unit and a third node of the second input unit, and the drain being connected to the other of the first node and the third node;

a second input transistor having a gate, a source, and a drain, the gate being connected to the input voltage source, the source of the second input transistor being connected to one of the second node of the first input unit and a fourth node of the second input unit, and the drain being connected to the other of the second node and the fourth node;

a third input transistor having a gate, a source, and a drain, the gate being connected to an output voltage of the amplifier, the source being connected to one of the second node of the first input unit and a fifth node of the second input unit, and the drain being connected to the other of the second node and the fifth node; and a fourth input transistor having a gate, a source, and a drain, the gate being connected to the output voltage of the amplifier, the source being connected to one of the first node of the first input unit and a sixth node of the second input unit, and the drain being connected to the other of the first node and the sixth node.

16. The amplifier according to claim 15, wherein the second input unit comprises:

a first row of transistors connected in series between a power supply and a fifth current source and having the fifth node located at a connection of a source of one transistor in the first row and a drain of another transistor in the first row;

a second row of transistors connected in series between the power supply and a voltage source and having the fourth node located at a connection of a source of one transistor in the second row and a drain of another transistor in the second row;

a third row of transistors connected in series between the fifth current source and ground and having the sixth node located at a connection of a source of one transistor in the third row and a drain of another transistor in the third row; and a fourth row of transistors connected in series between the voltage source and ground and having the third node located at a connection of a source of one transistor in the fourth row and a drain of another transistor in the fourth row;

wherein a seventh node located where a terminal of a transistor in the second row connects to a terminal of the voltage source is connected to the output of the amplifier via a first compensation capacitor; and an eighth node located where a terminal of a transistor in the fourth row connects to a terminal of the voltage source is connected to the output of the amplifier via a second compensation capacitor.

17. The amplifier according to claim 16, wherein the output unit comprises:

a push-up transistor and a pull-down transistor connected in series between a power supply and a ground source, the push-up transistor having a gate terminal to receive a voltage from one of the seventh node and the eighth node, the pull-down transistor having a gate terminal to receive a voltage from the other one of the seventh node and the eighth node than that received by the gate terminal of the push-up transistor; and at least the first and second compensation capacitors connected in series between the seventh node and the eighth node;

wherein the amplifier output is connected to the first and second compensation capacitors at a connection point between the first and second compensation capacitors and to the push-up and pull-down transistors at a connection point between the push-up and pull-down transistors.

* * * * *